(12) United States Patent
Shin

(10) Patent No.: US 7,936,050 B2
(45) Date of Patent: May 3, 2011

(54) SEMICONDUCTOR DEVICE AND METHOD OF FABRICATING SEMICONDUCTOR DEVICE

(75) Inventor: Yong Wook Shin, Seoul (KR)

(73) Assignee: Dongbu Hitek Co., Ltd., Seoul (KR)

( * ) Notice: Subject to any disclaimer, the term of this patent is extended or adjusted under 35 U.S.C. 154(b) by 31 days.

(21) Appl. No.: 12/573,837

(22) Filed: Oct. 5, 2009

(65) Prior Publication Data

US 2010/0019396 A1  Jan. 28, 2010

Related U.S. Application Data

(62) Division of application No. 11/951,846, filed on Dec. 6, 2007, now Pat. No. 7,618,900.

(30) Foreign Application Priority Data

Dec. 28, 2006 (KR) .......................... 10-2006-0136509

(51) Int. Cl.
*H01L 21/31* (2006.01)

(52) U.S. Cl. ........ 257/634; 257/635; 257/647; 257/650; 257/E23.024

(58) Field of Classification Search .................. 257/634, 257/761, E23.024
See application file for complete search history.

(56) References Cited

FOREIGN PATENT DOCUMENTS

JP  2000-195946  7/2000
KR  10-2002-0061384  7/2002

*Primary Examiner* — Roy K Potter
(74) *Attorney, Agent, or Firm* — Workman Nydegger

(57) ABSTRACT

A semiconductor device may be fabricated according to a method that reduces stain difference of a passivation layer in the semiconductor device. The method may include forming top wiring patterns in a substrate, depositing a primary undoped silicate glass (USG) layer on the top wiring patterns to fill a gap between the top wiring patterns, and coating a SOG layer on the substrate on which the primary USG layer has been deposited. Next, the SOG layer on the surface of the substrate may be removed until the primary USG layer is exposed, and a secondary USG layer may be deposited on the substrate on which the primary USG layer has been exposed.

3 Claims, 2 Drawing Sheets

SEMICONDUCTOR DEVICE AND METHOD OF FABRICATING SEMICONDUCTOR DEVICE

CROSS-REFERENCE TO RELATED APPLICATION

This application is a divisional application of pending U.S. application Ser. No. 11/951,846, filed on Dec. 6, 2007, which claims priority to Korean Application No. 10-2006-0136509, filed on Dec. 28, 2006, which is incorporated herein by reference in its entirety.

BACKGROUND

1. Field of the Invention

The present invention relates, in general, to semiconductor devices and a method of fabricating semiconductor devices and, more particularly, to a method of reducing stain difference of a passivation layer after a pad is formed.

2. Background of the Invention

A semiconductor device is a kind of a circuit device in which conductive, nonconductive, and semiconductor films may be formed on a semiconductor substrate and then processed to form electronic and electrical elements and wirings. As the degree of integration of semiconductor devices increases, a width of a wiring and an element becomes very small. Thus, the semiconductor device becomes very complex, calling for precise control of conditions for a formation process thereof.

To achieve high integration of semiconductor devices, the size of elements and wirings is continually decreasing. In order to form lots of elements in a limited area, a multi-layer structure may-be used. Further, to connect elements and wirings and to connect upper and lower wirings, holes may be formed in a pre-metal dielectric (PMD) layer and then filled with conductive material to form contacts.

Terminals may be formed in the semiconductor device for connecting circuits in a lower substrate, comprising various elements and wirings, to external circuits and to other upper substrate structures.

A terminal, i.e. a pad, may be formed from metal, such as aluminum (Al), as part of a metal line. A semiconductor device in which pads are formed may be covered with a passivation layer over all so as to prevent external shock and/or the introduction of moisture, oxygen and so on. The passivation layer may also prevent the influence of a molding compound, applied in a subsequent packaging step, on the semiconductor device packaged inside the molding compound.

The passivation layer may be formed by using an oxide layer, such as high density plasma-undoped silicate glass (HDP-USG), or a silicon nitride layer, which may be deposited by a chemical vapor deposition (CVD) method employing high-density plasma. The layers can have a single layer structure or a multi-layered structure in which the oxide layer and the silicon nitride layer are alternately deposited.

As the degree of integration of semiconductor devices increases, a space between top metal patterns also tends to become narrower. In particular, high density memory products often have a great difference in the degree of integration. For example, some memory products are divided into a memory region with a high degree of integration and a logic region with a low degree of integration. Accordingly, among other adverse effects associated with a higher degree of integration of top metal patterns, a stain difference may occur in a passivation layer when regions having a low degree of integration are also present.

In general, the passivation layer may have a thickness of about 12000 angstrom or higher. It is also inevitable that there is some stain difference due to equipment if the passivation layer is deposited by a CVD method. However, voids are generated because a deposited insulating (i.e., passivation) layer often does not completely fill all of the increasingly narrower spaces between metal patterns. Such stain difference becomes more profound due to these voids.

It is understood that in certain applications this stain difference phenomenon does not have a great influence on the external quality of semiconductor products, but can be considered as a failure in terms of external appearance. In products using capacitors, however, this phenomenon should preferably be eliminated because it may have an effect on a capacitor's coupling ratio.

SUMMARY OF SOME EXAMPLE EMBODIMENTS

In general, example embodiments of the invention relate to semiconductor devices and a method of fabricating semiconductor devices, in which the occurrence of stain difference when forming a passivation layer deposited on a top wiring or a pad of the semiconductor device can be prevented.

Example embodiments of the invention further relate to semiconductor devices and a method of fabricating semiconductor devices, in which the occurrence of stain difference due to a phenomenon in which a passivation layer is not sufficiently filled since a space between patterns is narrower in some regions than others when the passivation layer of the semiconductor device is formed can be prevented.

In accordance with example embodiments, there is provided a semiconductor device and a method of fabricating the semiconductor device. The method may include forming top wiring patterns in a substrate, depositing a primary USG layer on the top wiring patterns to fill a gap between the top wiring patterns, and coating a spin on glass (SOG) layer on the substrate on which the primary USG layer has been deposited. Then the SOG layer on the surface of the substrate may be removed until the primary USG layer is exposed, and a secondary USG layer may be deposited on the substrate on which the primary USG layer has been exposed.

BRIEF DESCRIPTION OF THE DRAWINGS

Aspects of example embodiments of the invention will become apparent from the following description of example embodiments given in conjunction with the accompanying drawings, in which.

DETAILED DESCRIPTION OF SOME EXAMPLE EMBODIMENTS

Hereinafter, aspects of example embodiments of the present invention will be described in detail with reference to the accompanying drawings so that they can be readily implemented by those skilled in the art.

Figure 1:
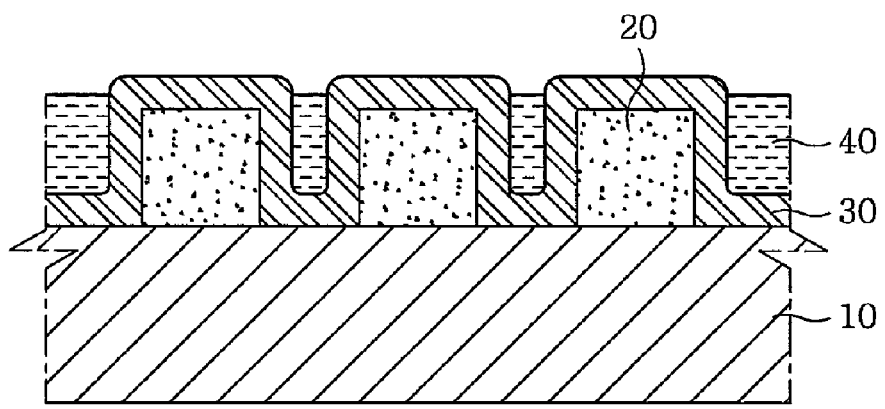
FIGS. 1 to 3 are cross-sectional views illustrating semiconductor device portions in major steps of a method consistent with the present invention.
Figure 2:
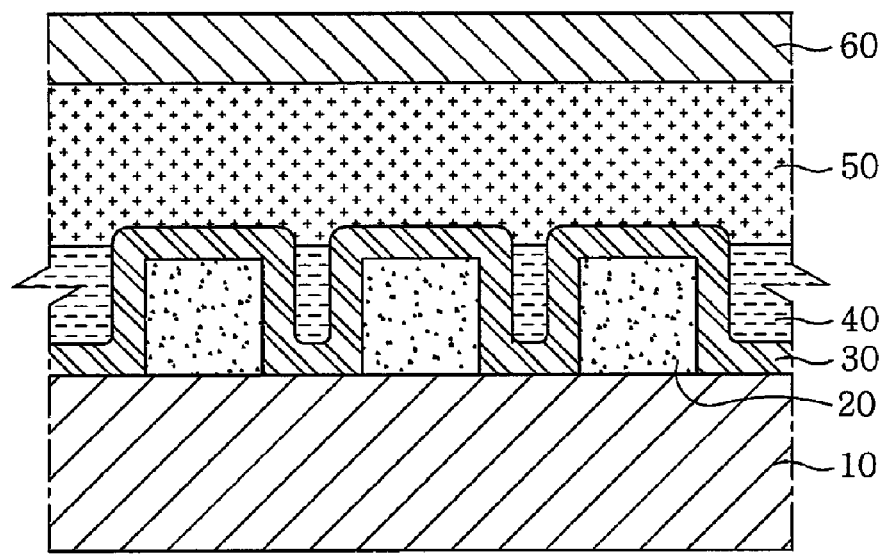
Figure 3:
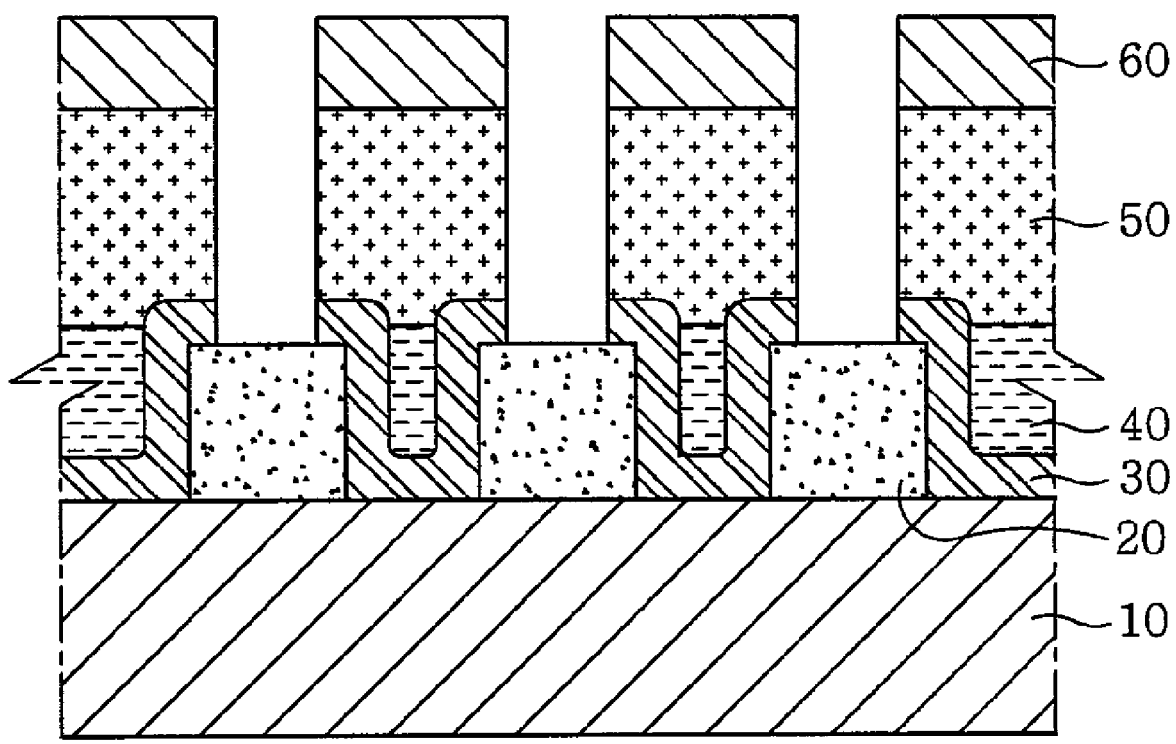

FIGS. 1 to 3 are cross-sectional views illustrating semiconductor device portions in major steps of a method consistent with the present invention.

Referring to FIG. 1, a high-density USG layer 30, as a passivation layer, may be formed on a substrate 10 in which top wiring patterns 20 are formed. The high-density USG layer 30 may be formed by a CVD method. The USG layer 30 may be deposited to a thickness so that a space or a gap between the wiring patterns 20 is filled about a half, e.g., about ⅓ to ¾. If the thickness of the USG layer 30 is too thin, a subsequent spin on glass (SOG) layer can have an effect on the top wiring patterns. However, if the USG layer 30 is too thick, voids can be generated due to overhang, etc., which occurs in some regions before the SOG layer is deposited.

In other words, assuming that the gap between the metal patterns 20 is 5000 angstrom, the thickness of the USG passivation layer 30 that covers the sidewalls of the metal patterns, may be about 3000 angstroms (1500 angstroms on each sidewall). The USG passivation layer 30 should have a thickness so as not to fill the spaces between metal patterns 20. If the USG passivation layers protruding from the sidewalls of the metal patterns 20 meet together at the middle of the spaces between metal patterns 20 in an overhang fashion, not only could voids be created in the spaces, but also a stain difference may occur.

The SOG layer 40 may then be deposited. The SOG layer 40 may be deposited to the extent that the spaces unfilled between the patterns are filled with the SOG layer 40. That is, if a gap of about 2000 angstroms remains in each space after the USG layer 30 is formed, the thickness of the USG layer 30 and SOG layer 40 added to each sidewall may appropriately be about 2500 angstroms.

Curing may be performed through a thermal process in order to polish the SOG layer 40 and increase the density of the structure. The thermal process for curing greatly contributes to stabilization of semiconductor devices. A curing temperature may differ depending on components of the SOG layer 40 and is conventionally in a range of about 400° C. to 500° C.

The SOG layer 40 may then be removed. For example, the SOG layer 40 can be removed by performing etch-back until the top of the deposited USG layer 30 is exposed and then performing over-etch for a predetermined time after the USG layer 30 is detected through etch end point detection (EPD). In other words, the SOG layer 40 does not remain on the top with respect to the USG layer 30. If the SOG layer 40 remains on the USG layer 30, undesirable side effects may occur due to the exposure of the SOG layer 40 in a process such as pad open.

If the SOG layer 40 is etched by a full etch-back method, SOG remains only in a pocket between the USG passivation layers covering opposing sidewalls of the top metal patterns. The USG passivation layers covering each sidewall may be about 1500 angstroms in thickness.

Referring to FIG. 2, a second USG layer 50 may be deposited to a thickness of about 5000 to 10,000 angstroms, thus completely precluding external contact with the SOG layer 40 and precluding occurrence of any side effects due to external contact with the SOG layer 40. A SiN layer 60 may then be deposited to a thickness of 4000 angstroms.

Referring to FIG. 3, the passivation layer 30 may be patterned to expose pad portions. In the patterning process, a photoresist pattern to protect regions other than the pads may be formed through an exposure process, as in a common patterning process. The passivation layer 30 may then be etched by using the patterns as an etch mask, thus exposing the pad portions. The etched portions do not include portions where the SOG layer 40 is formed to avoid problems that would occur if the SOG layer 40 were exposed. In certain embodiments, the pad portions can be exposed through EPD and over-etch can be performed for a predetermined time in order to completely expose the pad portions.

Thereafter, if plasma is used to etch, annealing may be performed at a temperature of 300 degrees Celsius to minimize undesirable effects of the plasma.

In summary, according to exemplary embodiments formation of voids within a passivation layer of a semiconductor device, which may occur due to a dense pattern of a top wiring layer (metal layer), can be prevented. Thus, the occurrence of a stain difference of the passivation layer due to voids, etc. can be prevented. Accordingly, external failure and the influence of voids on a coupling ratio in products using capacitors can be prevented.

While the invention has been shown and described with respect to the specific embodiment, it will be understood by those skilled in the art that various changes and modifications may be made without departing from the spirit and scope of the invention as defined in the following claims.

What is claimed is:

1. A semiconductor device comprising:
   top wiring patterns formed in a substrate;
   a primary USG layer formed on the top wiring patterns to fill a gap between the top wiring patterns;
   an SOG layer formed on the substrate on which the primary USG layer is deposited, wherein the SOG layer further fills the gap between the top wiring patterns and exposes the primary USG layer; and
   a secondary USG layer formed on the substrate on which the primary USG layer is exposed.

2. The semiconductor device of claim 1, further comprising a silicon nitride layer formed on the secondary USG layer.

3. The semiconductor device of claim 1, wherein the primary USG layer is not exposed by the SOG layer at a region corresponding to the gap between the top wiring patterns.

* * * * *